(12) United States Patent
Nakamuta

(10) Patent No.: US 7,330,057 B2
(45) Date of Patent: Feb. 12, 2008

(54) DPLL CIRCUIT HAVING HOLDOVER FUNCTION

(75) Inventor: Koji Nakamuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/488,047

(22) Filed: Jul. 18, 2006

(65) Prior Publication Data

US 2007/0182467 A1 Aug. 9, 2007

(30) Foreign Application Priority Data

Feb. 8, 2006 (JP) ............................. 2006-031340

(51) Int. Cl.
*H03L 7/06* (2006.01)
(52) U.S. Cl. ..................... 327/156; 327/147
(58) Field of Classification Search ................. None
See application file for complete search history.

(56) References Cited

U.S. PATENT DOCUMENTS

| | | | | |
|---|---|---|---|---|
| 5,604,468 A | * | 2/1997 | Gillig | .................. 331/176 |
| 6,542,044 B1 | * | 4/2003 | Berquist et al. | ............ 331/176 |
| 7,064,617 B2 | * | 6/2006 | Hein et al. | ..................... 331/16 |
| 2002/0190764 A1 | * | 12/2002 | Nichols | ....................... 327/156 |
| 2003/0185331 A1 | * | 10/2003 | Agizim et al. | .............. 375/376 |

FOREIGN PATENT DOCUMENTS

| | | |
|---|---|---|
| JP | 2-312318 | 12/1990 |
| JP | 7-240684 | 9/1995 |

\* cited by examiner

*Primary Examiner*—N. Drew Richards
*Assistant Examiner*—Cassandra Cox
(74) *Attorney, Agent, or Firm*—Kratz, Quintos & Hanson, LLP

(57) ABSTRACT

The invention relates to a digital synchronization network, and provides a DPLL circuit having a holdover function that generates a high-precision reference clock with a temperature correction to perform a free-running frequency control at a holdover time. In a holdover mode of the DPLL circuit using a DDS, the DPLL circuit having a holdover function adds a correction value calculated from a temperature characteristic of a slave oscillator to a fixed DDS control value during a detection of a holdover, thereby changing the DDS control value according to the temperature characteristic.

3 Claims, 6 Drawing Sheets

DPLL CIRCUIT HAVING HOLDOVER FUNCTION

TECHNICAL FIELD

The present invention relates to a digital network synchronizer. Particularly, the invention relates to a digital phase-locked loop (DPLL) circuit having a holdover function that generates a high-precision reference clock, with temperature correction, to perform free-running frequency control during holdover time.

BACKGROUND ART

A general DPLL circuit will be briefly explained. FIG. 1 is a block diagram of a DPPL circuit. FIG. 2 is a graph showing an operation example of a digital phase detector (DPD) 1. FIG. 3 is an explanatory diagram of an operation example of a direct digital synthesizer (DDS) 3.

In FIG. 1, a DPLL circuit includes the DPD 1, a digital loop filter (DLF) 2, a slave oscillator 5, an analog PLL or a multiply circuit 6 that generates a phase count clock, and a frequency divider 4 that converts an output frequency into an input frequency. As shown in FIG. 2, the DPD 1 counts the time between a rising edge of a reference clock (REF_CLK) and a rising edge of a feedback clock (FB_CLK), in a high-speed clock. The DPD 1 outputs a difference $\Delta\phi$ (one count, in the case of the example shown in FIG. 2) between this count and a phase count value at a target convergence point. The APLL, or the multiply circuit 6, shown in FIG. 1 generates a high-speed clock for counting.

The DLF 2 averages a phase error detected by the DPD 1, and smoothes the phase error. The DDS 3 generates an output oscillation waveform by combining digital data called a tuning word (TW), using a clock of a fixed oscillator as an oscillation source. The output frequency can be controlled using the TW. The TW corresponds to a control voltage of voltage controlled oscillator (VCO). FIG. 3 shows the operation of the DDS 3 in detail.

As shown in FIG. 3, a phase accumulator sequentially adds tuning words in a cycle of the input clock 5. When the sum exceeds a value $2^N$ ($=2\pi$) which is expressed in a bit length N (=32 bits) of the phase accumulator, the phase accumulator adds up a difference from 0 after an overflow, thereby repeating an update. An output value from the phase accumulator is converted into a sinusoidal wave, using a sinusoidal wave lookup table stored in a memory. A digital output value which is D/A converted into an analog value becomes an output value of the DDS 3.

When a value of a tuning word is large, a slope of the accumulated sum of tuning words becomes large, and a time taken until an overflow is reached becomes short (i.e., the frequency becomes high, and the phase progresses). On the other hand, when a value of a tuning word is small, a slope of the accumulated sum of tuning words becomes small, and a time taken until when an overflow is reached becomes long (i.e., the frequency becomes low, and the phase is delayed). The frequency divider 4 divides an input frequency into 1/N (for example, 8 KHz or 125 μS) that coincides with a frequency (REF_CLK) of the output clock of the DDS 3.

The basic operation of the DPLL is explained below.

(1) The DPD 1 compares the phase of the reference clock with the phase of the feedback clock.

(2) The DLF 2 averages the error signal (value) $\Delta\phi$ output from the DPD 1, and adds the averaged value as a correction value to the TW of the DDS 3.

(3) The DDS 3 controls a DDS output frequency Fout so that the correction value becomes close to the reference clock frequency (REF_CLK).

After the operations (1) to (3) are repeated, the output frequency (i.e., a deviation) of the DDS 3 finally coincides with the frequency (i.e., a deviation) of the reference clock.

The DDS 3 generates an output clock of the frequency corresponding to a control value called a tuning word (TW), based on the reference clock frequency. The output frequency (Fout) is given by the following expression 1.

$$Fout = Fosc \times TW/2^{NA} \qquad \text{(Expression 1)}$$

where
Fout denotes an output frequency,
TW denotes a tuning word, and
NA denotes a bit length of the DDS phase accumulator.

Because Fosc and NA are fixed values, Fout can be controlled based on TW.

The "holdover" refers to a state where, when a trouble occurs in the reference clock (REF_CLK), the clock starts to free run in the frequency deviation immediately before the occurrence of the trouble, and thereafter, the operation continues at the precision of the slave oscillator. Therefore, in general, an oven-controlled crystal oscillator (OCXO) having excellent frequency stability is used for the slave oscillator. However, a synchronization signaling transmission (stratum3E) crystal oscillator requires a temperature characteristic plus minus 10 ppb and a most severe standard for the frequency stability for the OCXO during the holdover period.

Conventionally, a DPLL circuit that generates a reference clock to achieve digital network synchronization is used for a transmitter (such as an optical transmitter and a mobile communication device) within the digital synchronization network. In this case, a reference clock source is present at the highest level of the digital synchronization network. Generally, a cesium atomic oscillator, as a primary standard oscillator, is used for the reference clock source.

Each transmitter within the synchronization network includes a synchronization (Synch) unit that generates a clock to be used within the transmitter based on the clock distributed from the reference clock source. A characteristic of the clock generated by the synchronization unit is prescribed in detail for each subordinate stratum in the synchronization network in ITU810 and GR-1244 (Bellcore). The frequency precision during the holdover is also prescribed in ITU810 and GR-1244 (Bellcore).

As described above, the DPLL corrects a DDS control value (i.e., a tuning word: TW), based on a phase error signal between the phase of the reference clock (REF_CLK) and the phase of the feedback clock (FB_CLK), thereby making the "reference clock frequency (deviation)" coincide with the "output frequency deviation of the DDS". Therefore, when a trouble occurs in the reference clock, a phase error signal cannot be generated, and the DDS control value (TW) cannot be corrected. Consequently, in general, a holdover circuit fixes the DDS control value to a control value immediately before the occurrence of the trouble.

As explained above, according to the conventional technique, while the DDS control value is fixed during the holdover period, the output frequency (Fout) of the DDS 3 depends on the frequency (Fosc) of the slave oscillator 5 as is clear from the expression 1. Therefore, the output frequency of the DPLL during the holdover directly reflects the frequency and temperature characteristics of the slave oscillator 5. In order to solve this problem, a temperature compensator (i.e., a variable delay circuit) is added to the PLL circuit to control the free-running frequency of the PLL circuit, thereby obtaining a highly stable free-running frequency, as disclosed in Japanese Patent Application Unexamined Publication No. 7-240684.

However, this method has a problem in that the temperature compensation operation is limited to the time of detecting a disconnection of the input of the reference clock. In fact, the holdover operation is not limited to the time of detecting a disconnection of the input of the reference clock, and is also necessary at the time of detecting a circuit trouble of the DPD 1, the DLF 2, and the frequency divider 4, and a disconnection of the input of the feedback clock.

DISCLOSURE OF THE INVENTION

In the light of the above problems, it is an object of the present invention to provide a DPLL circuit having a holdover function capable of correcting a DDS control value, based on a frequency temperature characteristic of a slave oscillator, by providing a holdover circuit at an input stage of the DDS 3, the holdover circuit being capable of fixing the DDS control value to a value immediately before a detection of a trouble, when a holdover process becomes necessary due to various troubles.

According to a first aspect of the present invention, there is provided a DPLL circuit having a holdover function that adds a correction value calculated from a temperature characteristic of a slave oscillator to a fixed DDS control value during a detection of a holdover, thereby changing the DDS control value according to the temperature characteristic, in a holdover mode of the DPLL circuit using a DDS.

According to a second aspect of the invention, there is provided a DPLL circuit having a holdover function, the DPLL circuit including: a temperature sensor that detects an ambient temperature; a characteristic holder that holds a temperature-frequency variation characteristic of a slave oscillator; a correction value converter that gives a DDS control correction value, based on a detection signal from the temperature sensor and information held in the characteristic holder; a holdover circuit that gives a DDS control value immediately before the occurrence of a trouble as a fixed value; an adder that adds a DDS control correction value from the correction value converter and a DDS control value of the holdover circuit, and outputs the sum; and a selector that selectively outputs one of an output from the adder and an output from a DLF, wherein the selector selects an output from the adder and controls the DDS, in a holdover mode.

According to the present invention, the DPLL circuit calculates a correction value that offsets a frequency temperature change of a temperature obtained from a temperature sensor such as a thermistor, based on a temperature characteristic of a slave oscillator, and adds the correction value to a holdover control value. With this arrangement, it becomes possible to suppress a frequency variation due to a change in the ambient temperature.

BRIEF DESCRIPTION OF THE DRAWINGS

The present invention will be more clearly understood from the description as set forth below with reference to the accompanying drawings, wherein.

BEST MODE FOR CARRYING OUT THE INVENTION

Figure 1:
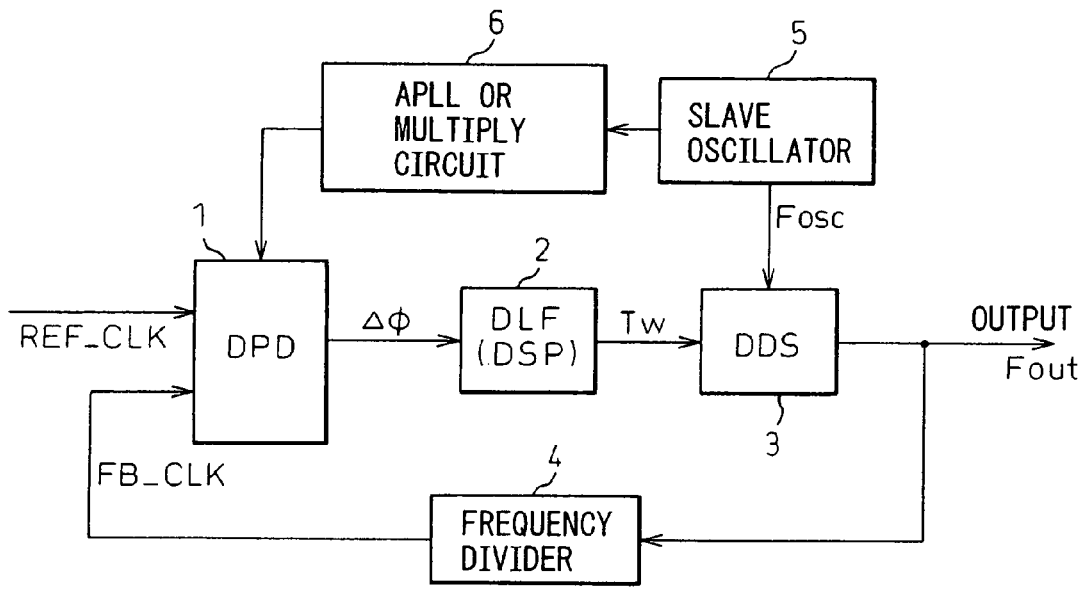
FIG. 1 is a block diagram of a DPLL circuit.
Figure 2:
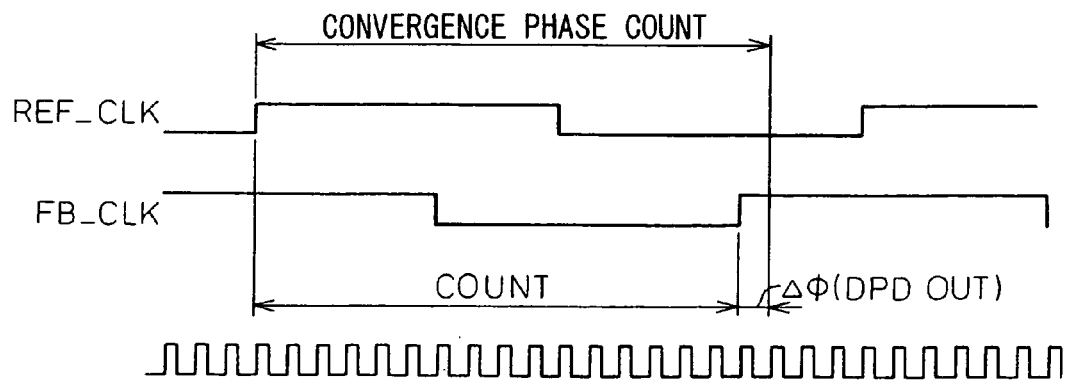
FIG. 2 is a graph showing one example of the operation of a DPD.
Figure 3:
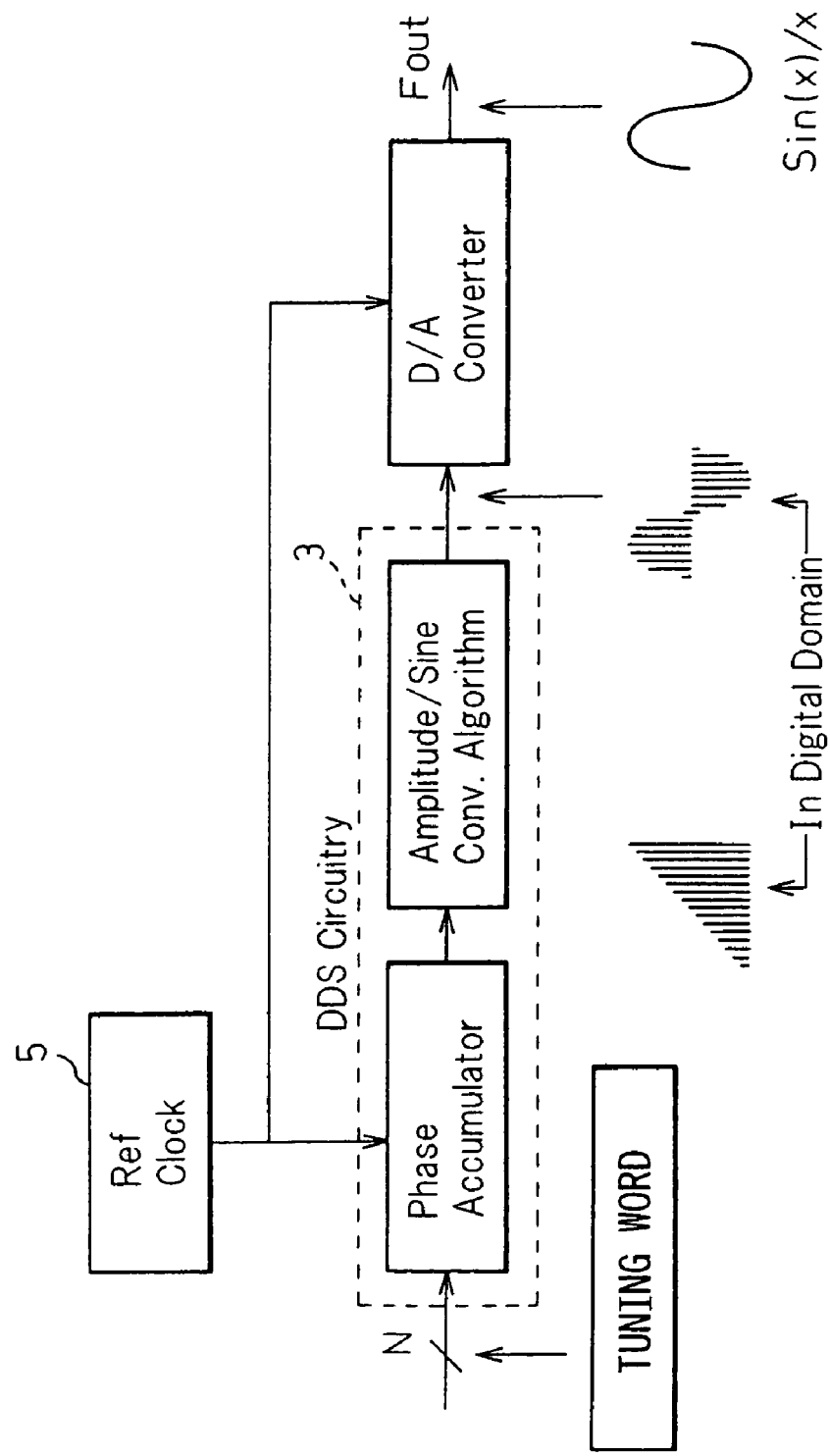
FIG. 3 is an explanatory diagram showing one example of the operation of a DDS.
Figure 4:
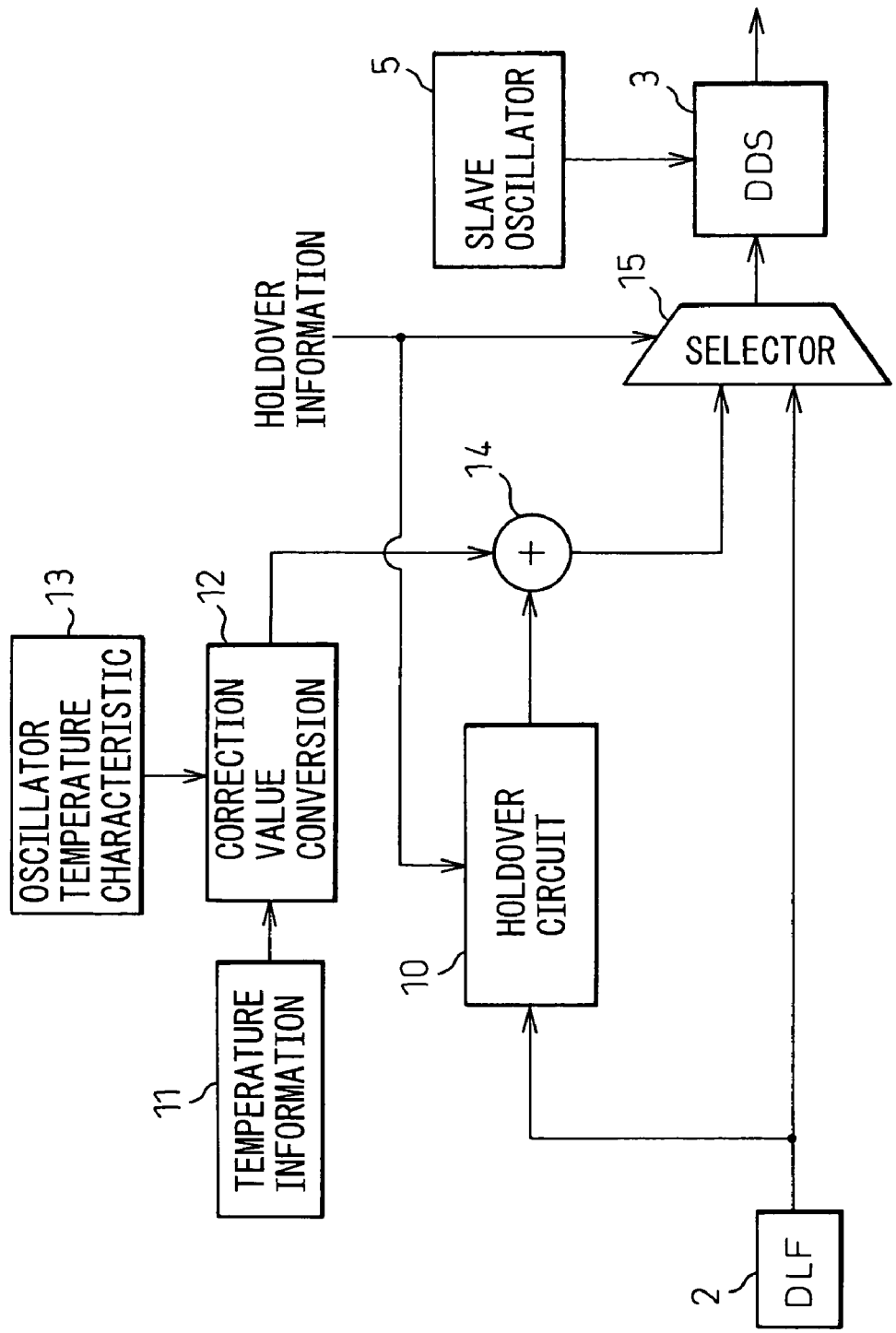
FIG. 4 is a block diagram showing a basic configuration of a DPLL circuit having a holdover function according to the present invention.

FIG. 4 is a block diagram showing a basic configuration of a DPLL circuit having a holdover function according to the present invention.

In FIG. 4, a holdover circuit 10 is provided between the DLF 2 and the DDS 3. The holdover circuit 10 inputs a set value of the DDS 3 to the DDS 3 via an adder 14 and a selector 15. The holdover circuit 10 receives holdover information to inform it that a holdover process has become necessary due to various troubles, and gives a set value (such as a TW) immediately before the occurrence of the trouble, to the DDS 3 as a fixed value, thereby making the DDS 3 perform a free run at a frequency deviation at this time. Thereafter, the DDS 3 maintains operation in the precision of the slave oscillator 5.

The adder 14 adds a differential to the fixed value, based on ambient temperature information or the like described later. The selector 15 selects control information (i.e., a fixed value plus temperature control information) of a trouble time from the holdover circuit 10 and the adder circuit 14, in place of the control information of a normal time at the DLF 2 side, based on the holdover information, and gives the selected control information to the DDS 3 as its set value.

Therefore, during the trouble time, the DDS 3 continues the operation state, following the set value (i.e., a fixed value) immediately before the occurrence of a trouble and the temperature control information (i.e., a variable value that offsets the temperature characteristic of the slave oscillator 5). In this case, a trouble can occur due to various factors such as a disconnection of the input of a reference clock, a trouble in the circuit such as the DPD 1, the DLF 2, and the frequency divider 4, and a disconnection of the input of a feedback clock.

During the normal period (i.e., when the selector 15 selects the DLF 2), the temperature characteristic of the slave oscillator 5 is masked, because the DDS 3 is feedback controlled in a state that the control information includes the ambient temperature information. However, during the holdover period (i.e., when a trouble is detected), the feedback control does not work, and the DDS 3 directly receives the influence of the temperature characteristic of the slave oscillator 5.

Figure 5:
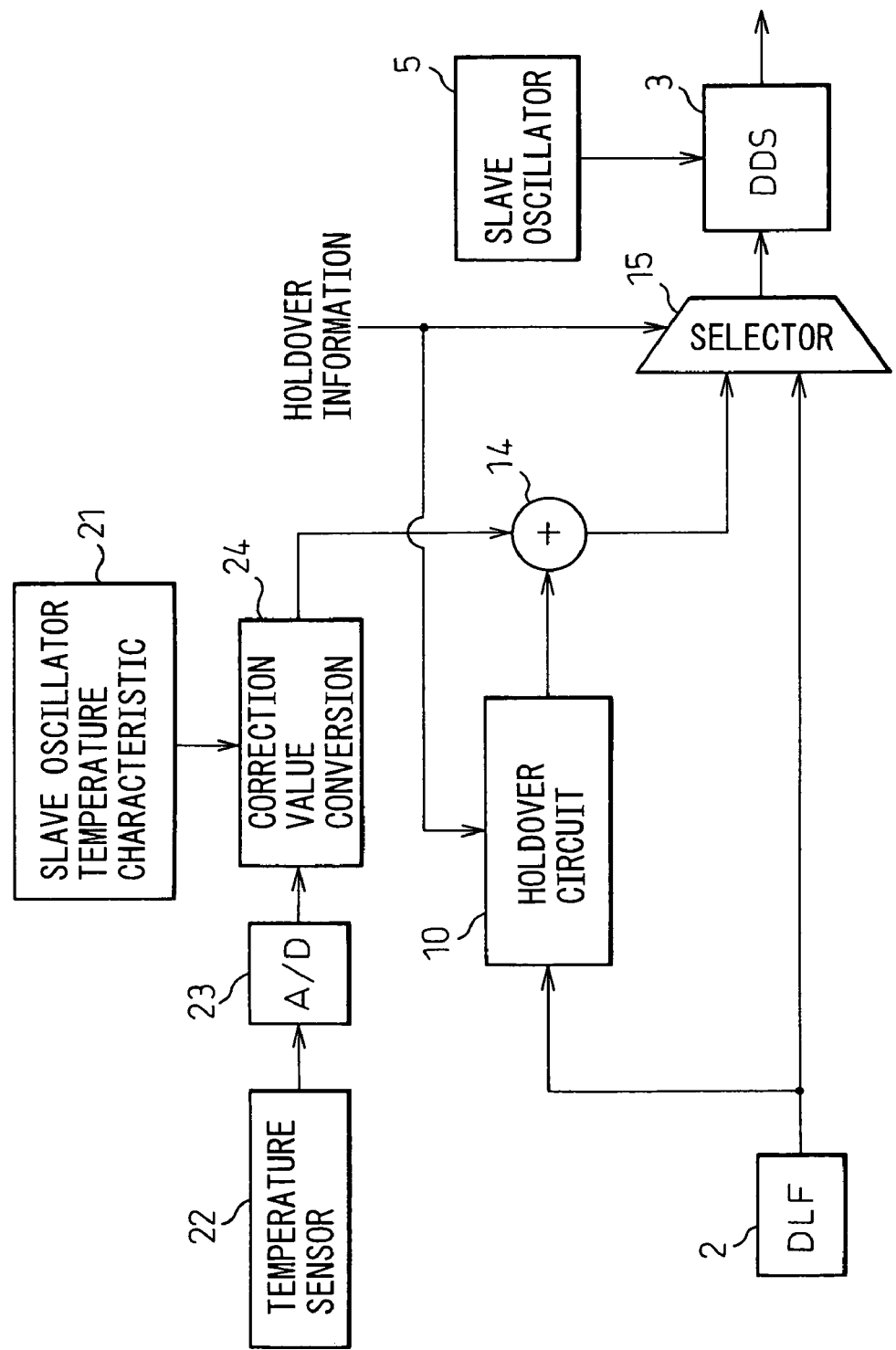
FIG. 5 is a block diagram of a DPLL circuit according to a first embodiment of the present invention.

FIG. 5 is a block diagram of a DPLL circuit according to a first embodiment of the present invention.

In FIG. 5, a temperature sensor 22, such as a thermistor, monitors the ambient temperature, and an A/D converter 23 converts this information into digital data. A correction value converter 24 calculates a temperature correction value, based on the digital data and a temperature characteristic 21 of the slave oscillator 5 determined in advance, and adds the calculated temperature correction value to the control value (i.e., a fixed value) during the holdover time as indicated by a reference numeral 14. The DPL circuit controls the DDS 3, using the correction value after the temperature correction.

Figure 6:
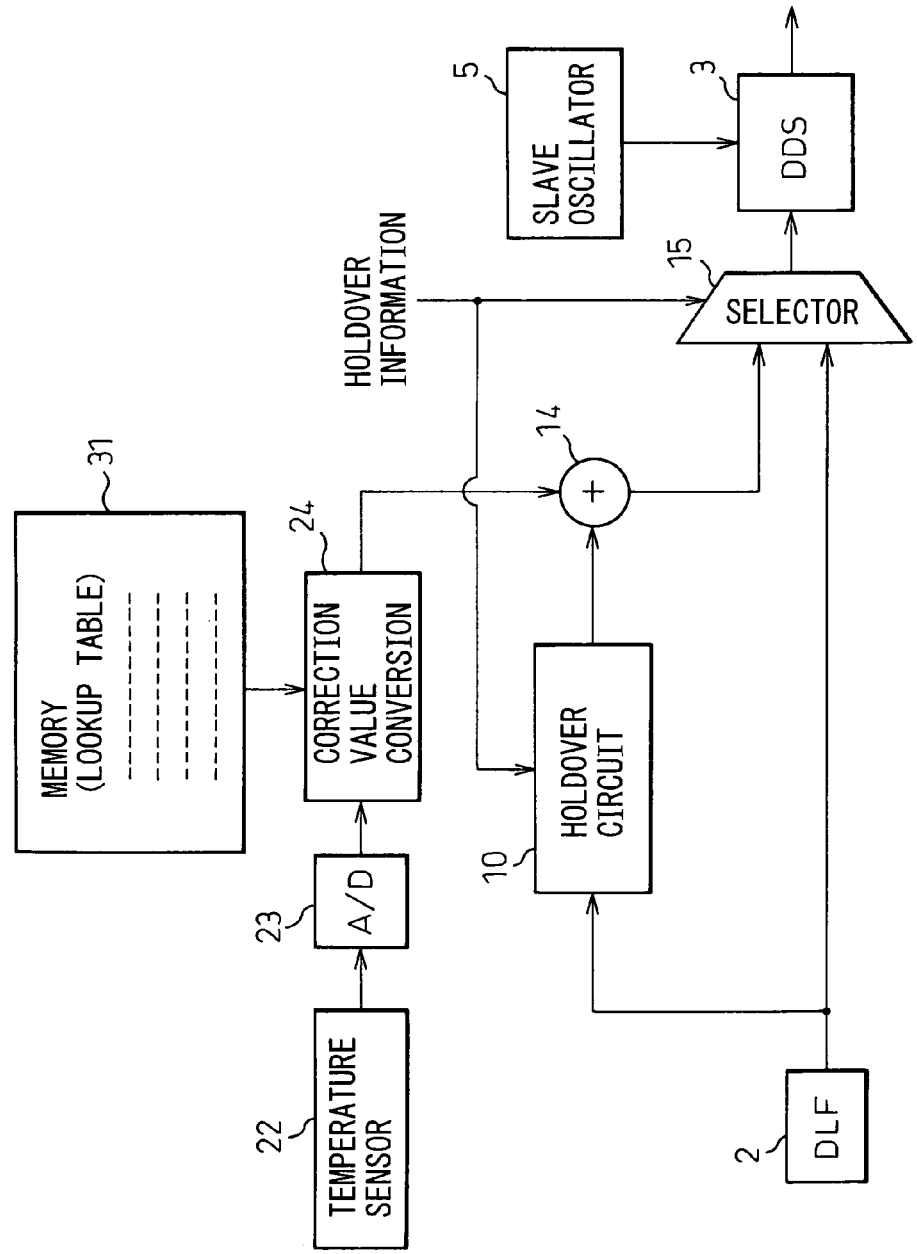
FIG. 6 is a block diagram of a DPLL circuit according to a second embodiment of the present invention.

FIG. 6 is a block diagram of a DPLL circuit according to a second embodiment of the present invention.

A configuration of the DPLL is similar to that shown in FIG. 5, except that the DPLL converts a correction value based on a lookup table 31 stored in a memory. Using the lookup table is effective to simplify the calculation when the temperature characteristic of the oscillator is expressed in a two-dimensional curve or a three-dimensional curve.

Figure 7:
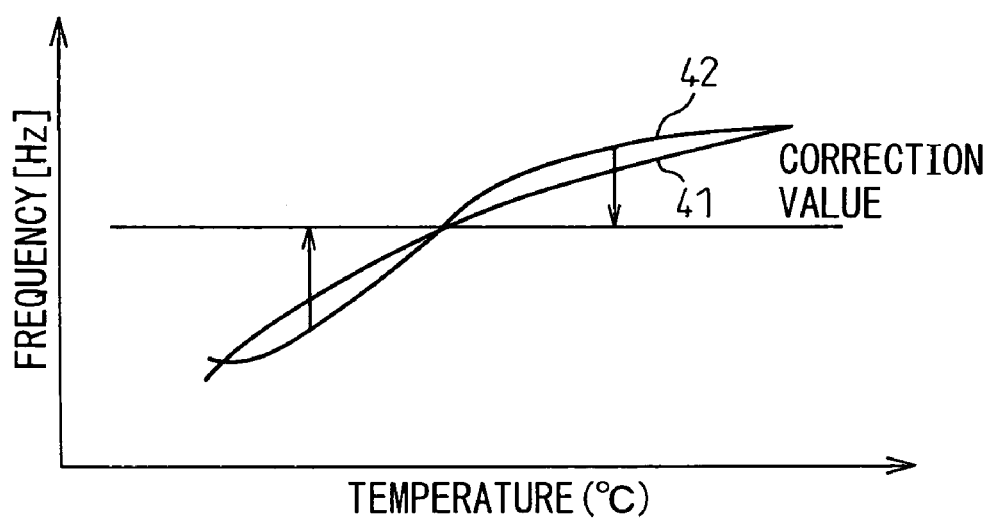
FIG. 7 is a graph showing one example of a temperature characteristic of a slave oscillator.

FIG. 7 is a graph showing one example of a temperature characteristic of the slave oscillator 5.

As shown in FIG. 7, when the temperature characteristic can be approximated by a simple straight line or an exponential function as indicated by reference numeral 41, a configuration having no memory as shown in FIG. 5 is advantageous. On the other hand, when the temperature characteristic is expressed in a two-dimensional curve or a three-dimensional curve as indicated by a reference numeral 42, the configuration shown in FIG. 6 is advantageous in obtaining high precision of the operation and a high speed. The correction value converter 24 converts the control value to a correction value so that the frequency does not change due to temperature, in both cases, as shown in FIG. 7.

The invention claimed is:

1. A digital phase locked loop (DPLL) circuit having a holdover function that adds a correction value calculated from a temperature characteristic of a slave oscillator to a fixed direct digital synthesizer (DDS) control value during a detection of a holdover, thereby changing the DDS control value according to the temperature characteristic, in a holdover mode of the DPLL circuit using the DDS.

2. A digital phase locked loop (DPLL) circuit having a holdover function, the DPLL circuit comprising:
   a temperature sensor that detects an ambient temperature;
   a characteristic holder that holds a temperature-frequency variation characteristic of a slave oscillator;
   a correction value converter that gives a direct digital synthesizer (DDS) control correction value, based on a detection signal from the temperature sensor and information held in the characteristic holder;
   a holdover circuit that gives a DDS control value immediately before the occurrence of a trouble as a fixed value;
   an adder that adds a DDS control correction value from the correction value converter and a DDS control value of the holdover circuit, and outputs the sum; and
   a selector that selectively outputs one of an output from the adder and an output from a digital loop filter (DLF), wherein
   the selector selects an output from the adder, and controls the DDS, in a holdover mode.

3. The DPLL circuit having a holdover function according to claim 2, wherein
   the characteristic holder holds the held information as table information.

\* \* \* \* \*